United States Patent
Baek et al.

(10) Patent No.: US 7,569,153 B2
(45) Date of Patent: Aug. 4, 2009

(54) FABRICATION METHOD OF LIQUID CRYSTAL DISPLAY DEVICE

(75) Inventors: Myoung Kee Baek, Gyeonggi-Do (KR); Yong-Jin Cho, Seoul (KR); Kwon Shik Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 191 days.

(21) Appl. No.: 10/422,739

(22) Filed: Apr. 25, 2003

(65) Prior Publication Data
US 2003/0219920 A1 Nov. 27, 2003

(30) Foreign Application Priority Data
May 23, 2002 (KR) .................. 10-2002-0028744
Dec. 27, 2002 (KR) .................. 10-2002-0085626

(51) Int. Cl.
*C30B 33/00* (2006.01)
(52) U.S. Cl. ........................... 216/23; 216/41; 101/170
(58) Field of Classification Search ............ 216/41–54, 216/13, 33, 24, 23; 430/309–320; 438/701, 438/717, 736, 149–166; 101/150, 170, 153, 101/158, 163
See application file for complete search history.

(56) References Cited

U.S. PATENT DOCUMENTS

| 3,701,317 | A | * | 10/1972 | Miyamoto et al. .......... 101/170 |
| 4,294,650 | A | | 10/1981 | Werthmann .................. 156/660 |
| 4,883,941 | A | | 11/1989 | Martin et al. |
| 5,101,759 | A | * | 4/1992 | Hefele ......................... 118/202 |
| 5,127,330 | A | | 7/1992 | Okazaki et al. |
| 5,259,926 | A | | 11/1993 | Kuwabara et al. ........ 156/659.1 |
| 5,425,848 | A | * | 6/1995 | Haisma et al. ................ 216/48 |
| 5,514,503 | A | | 5/1996 | Evans et al. ..................... 430/7 |
| 5,544,582 | A | | 8/1996 | Bocko et al. ................. 101/211 |
| 5,678,483 | A | | 10/1997 | Johnson ...................... 101/153 |
| 5,701,815 | A | | 12/1997 | Bocko et al. ................. 101/211 |
| 5,719,078 | A | * | 2/1998 | Kim ............................ 438/158 |
| 5,972,545 | A | | 10/1999 | Eid et al. |
| 6,001,515 | A | | 12/1999 | Evans et al. ..................... 430/7 |
| 6,255,130 | B1 | * | 7/2001 | Kim ............................. 438/30 |
| 6,356,318 | B1 | | 3/2002 | Kawahata .................... 349/38 |
| 6,635,581 | B2 | * | 10/2003 | Wong ......................... 438/736 |

FOREIGN PATENT DOCUMENTS

| CN | 87105395 | 5/1988 |
| CN | 1042097 | 5/1990 |
| CN | 1153710 | 7/1997 |

(Continued)

OTHER PUBLICATIONS

Chinese Office Action dated May 13, 2005 (with English translation).

*Primary Examiner*—Roberts Culbert
(74) *Attorney, Agent, or Firm*—McKenna Long & Aldridge LLP

(57) ABSTRACT

A method for forming a pattern includes forming a resist pattern on a printing roll, printing a multi-stepped resist pattern on an etching object layer formed on a substrate by using the printing roll and etching the etching object layer by using the printed resist pattern as a mask.

1 Claim, 11 Drawing Sheets

| | FOREIGN PATENT DOCUMENTS | |
|---|---|---|
| EP | 0 471 628 A1 | 2/1992 |
| JP | 55149919 | 11/1980 |
| JP | 63033730 | 2/1988 |
| JP | 63205608 | 8/1988 |
| JP | 3-19889 | 1/1991 |
| JP | 494115 | 2/1992 |
| JP | 05-011270 | 1/1993 |
| JP | 5011270 | 1/1993 |
| JP | 06-106896 | 4/1994 |
| JP | 07-240523 | 9/1995 |
| JP | 7239410 | 9/1995 |
| JP | 7240523 | 9/1995 |
| JP | 10-82907 | 3/1998 |
| JP | 2001-216892 | 8/2001 |
| JP | 2001-326448 | 11/2001 |
| JP | 2002-098995 | 4/2002 |
| KR | 1020000055524 | 5/2000 |

\* cited by examiner

FABRICATION METHOD OF LIQUID CRYSTAL DISPLAY DEVICE

This application claims the benefit of Korean Application No. 2002-28744 filed in Korea on May 23, 2002 and Korean Application No. 2002-85626 filed in Korea on Dec. 27, 2002, which are hereby incorporated by reference in their entirety.

BACKGROUND OF THE INVENTION

1. Field of the Invention

The present invention relates to a fabrication method of a Liquid Crystal Display (LCD) device, and more particularly, to a fabrication method of a liquid crystal display device in which a pattern is formed by using a printing method.

2. Description of the Related Art

Recently, various portable electric devices, such as mobile phones, Personal Data Assistants (PDA), and notebook computers, have been developed. Such devices need a flat panel display device that is small, light weight, and power-efficient. To meet such needs, flat panel display device technologies, such as Liquid Crystal Display (LCD) technology, Plasma Display Panel (PDP) technology, Field Emission Display (FED) technology, and Vacuum Fluorescent Display (VFD) technology have been actively researched and developed. Of these flat panel display devices, the LCD is most prevalent because it can be mass produced, can be efficiently driven, and has a superior image quality.

FIG. 1 is a plan view showing a related art LCD that uses a thin film transistor as an active device. As shown in FIG. 1, each pixel includes a Thin Film Transistor (TFT) T formed adjacent to where a gate line 4 and a data line 6 cross one another in a pixel 1 of a display region. The gate line 4 carries control signals from an external driving circuit. The data line 6 carries an image signal. The TFT includes a gate electrode 3 connected to the gate line 4; a semiconductor layer 8a formed on the gate electrode 3; and source electrode 5a and drain electrode 5b formed to connect to the semiconductor layer 8a. The TFT is activated in response to a control signal applied to the gate electrode 3 from the gate line 4. A pixel electrode 10 is connected to the drain electrode 5b. The liquid crystal (not shown) in the pixel 1 is driven by applying an image signal through the source electrode 5a and drain electrode 5b when the semiconductor layer 8a is activated in response to a control signal applied to the gate electrode 3.

FIG. 2 is a cross sectional view of the related art TFT positioned in each pixel. As shown in FIG. 2, the TFT includes a substrate 10a made of transparent insulating material, such as glass. A gate electrode 3 is formed on the substrate 10a. A gate insulating layer 2 is formed over the entire substrate 10a on which the gate electrode 3 is formed. A semiconductor layer 8a is formed on the gate insulating layer 2. The source electrode 5a and drain electrode 5b are formed over the semiconductor layer 8a and respectively connected to the semiconductor layer 8a by ohmic semiconductor layers 8b. A pixel electrode 10 is connected to the drain electrode 5b. A passivation layer 9 is formed on the source electrode 5a and drain electrode 5b for protecting the device. The source and drain electrodes 5a and 5b of the TFT are electrically connected to a pixel electrode 10 when the TFT is activated to display an image in accordance with the signal applied to the pixel electrode 10 through the source electrode 5a and drain electrode 5b.

The TFT is fabricated with a manufacturing method that uses several different mask processes. The material and time consumed in each mask process directly impacts productivity. Thus, reducing the number of mask processes from a five mask process down to a four mask process increases productivity. A method for fabricating a TFT in accordance with a related art four mask process will be explained with reference to FIGS. 3A to 3E that sequentially shows a related art four mask process to manufacture a TFT.

As shown in FIG. 3A, a metallic layer is deposited on a transparent substrate 20, and then a first photoresist pattern 23a is formed by a photolithography process. A gate electrode 23 is then formed using the resist pattern 23a as a mask. The photolithography process includes depositing the photoresist, exposing the photoresist, developing the photoresist, and etching away the undesired portion of material to be patterned. During the time that the photoresist is being exposed, a mask over the photoresist is used to define a resist pattern. Also, in the etching process, a metal pattern, such as a gate electrode, is substantially formed by using the resist pattern formed after the development process as a mask. Subsequently, the resist pattern that remains on the metal layer is removed.

As shown in FIG. 3B, inorganic material, such as $SiN_x$ or $SiO_x$, a semiconductor layer 28a and 28b, and a metallic layer 25 are sequentially deposited on the substrate 20 on which the gate electrode 23 is formed. Then, a second resist pattern 23b, which remains over a channel region is formed with a photolithography process by using a second mask (not shown). A diffraction exposure is applied to the photoresist layer on the metallic layer 25 over the gate electrode 23 such that a portion of the resist pattern over the center of the channel region has a thinner thickness than the other regions of the resist pattern. Then, etching is performed using the second resist pattern 23b as a mask until the gate insulating layer 22 around the TFT is exposed. Next, as shown in FIG. 3C, the resist pattern region to which the diffraction exposure is applied is removed to form a third resist pattern 23c that is used to expose the metallic layer 25. Then, the metallic layer 25 is etched by using the third resist pattern 23c as a mask to thereby form source electrode 25a, drain electrode 25b, and ohmic semiconductor contact layers 28b.

The second mask described above is a diffraction mask that has different light transmittance ratios, so that a thickness of the resist pattern can be different in different portions of the resist pattern. Generally, a diffraction mask is used to pattern a photoresist that can be etched at least twice so that the same photoresist can be used to do at least two different patterns. For example, a single mask can be used to pattern active layers 28a and 28b, and metal layer 25 can be patterned, and then another patterning is performed to form the source electrode 25a, drain electrode 25b and ohmic semiconductor contact layers 28b. Thus, a five mask process for forming a TFT can be reduced to a four mask process.

As shown in FIG. 3D, the resist pattern which remains on the source electrode 25a and drain electrode 25b is removed. An inorganic material, such as $SiO_x$ or $SiN_x$, or an organic material, such as BCB (benzocyclobuten) or acryl, is deposited as a passivation layer 29 over the entire device including the source electrode 25a and drain electrode 25b. A fourth resist pattern 23d is formed using a third mask with a photolithography process. A hole is opened in the passivation layer 29 to exposes a part of the drain electrode 25b using the third mask. Then, as shown in FIG. 3E, the fourth resist pattern is removed, and a transparent conductive material, such as ITO (Indium Tin Oxide) is deposited on the passivation layer 29 and patterned by using a fourth mask to form a pixel electrode 31.

The photolithography process for fabricating the TFT is performed by repeatedly performing a series of consecutive processes, such as deposition, alignment, exposure, development, etching/deposition/implantation and cleaning. More specifically, the series of processes includes depositing the photoresist, aligning the mask to an alignment key, developing the photoresist by irradiating a light source on exposed portions of the photoresist, removing undeveloped resist, performing the etching/deposition/implantation manufacturing step and then cleaning the remaining resist from the device. As the number of masking processes increases, the greater chances are that misalignment will occur. Aligning the mask on the substrate, especially with sophisticated patterns, requires high accuracy. Otherwise, a major defect can occur. Thus, misalignment of the mask can also occur regardless of the number of masking processes.

Also, depositing the photoresist uniformly on the substrate includes: a pre-bake for improving adhesion of the photoresist by removing moisture from a surface of the substrate on which the photoresist will be deposited; spin-coating the photoresist onto the surface of the substrate by using a centrifugal force; and a soft-bake for solidifying the photoresist by evaporating solvent from the deposited photoresist. Spin coating is a process for distributing photoresist by a centrifugal force of the substrate in which photoresist is dropped into the center of a rotating substrate. The advantages of spin coating photoresist are that it is simple and fast. However, the disadvantages is that very little of the photoresist is deposited on the surface of the substrate. Most of the photoresist is wasted, which increases material cost. Further, the equipment needed for deposition, alignment, exposure, and cleaning are expensive, which also increases production cost.

SUMMARY OF THE INVENTION

Accordingly, the present invention is directed to a fabrication method of an LCD device that substantially obviates one or more of the problems due to limitations and disadvantages of the related art.

An object of the present invention is to provide a pattern forming equipment which can form a resist pattern without using photolithography.

Another object of the present invention is to provide a method for fabricating a liquid crystal display device which can simplify a patterning process.

To achieve these and other advantages and in accordance with the purpose of the present invention, as embodied and broadly described herein, there is provided a method for forming a pattern, including forming a resist pattern on a printing roll, printing a multi-stepped resist pattern on an etching object layer formed on a substrate by using the printing roll and etching the etching object layer by using the printed resist pattern as a mask.

In another aspect, a method for fabricating a liquid crystal display device includes forming an etching object layer including a semiconductor layer and a metallic layer on a substrate, printing a multi-stepped resist pattern on an etching object layer formed on a substrate by using the printing roll, and etching the etching object layer by using the resist pattern thereon as a mask.

In another aspect, a method for fabricating a liquid crystal display device includes: providing a transparent substrate; sequentially depositing an insulating layer, a semiconductor layer, and a metallic layer over an entire surface of the substrate; printing a resist pattern having different thicknesses on the metallic layer; and patterning a first electrode and a second electrode by using the resist pattern.

In another aspect, a method for fabricating a liquid crystal display device includes: providing a transparent substrate; forming a gate electrode on the substrate; sequentially depositing an insulating layer, a semiconductor layer, and a metallic layer over an entire surface of the substrate; printing a first resist pattern on the metallic layer; printing a second resist pattern surrounding the first resist pattern, wherein the second resist pattern has a greater thickness than the first resist pattern; forming an active layer, a source electrode and a drain electrode using the first and second resist patterns as a mask; forming a passivation layer over the source and drain electrodes; and forming a pixel electrode connected to the drain electrode on the passivation layer.

In another aspect, a method for fabricating a liquid crystal display device includes: providing a transparent substrate; forming a gate electrode on the substrate; sequentially depositing an insulating layer, a semiconductor layer, and a metallic layer over an entire surface of the substrate; uniformly applying a resist on the metallic layer; pressing the resist with a stamp to form a resist pattern having first, second and third depressions in which a thickness of the first depression is thinner than the second and third depressions surrounding the first depression; forming an active layer, a source electrode and a drain electrode by using the resist pattern as a mask; forming a passivation layer over the source and drain electrodes; and forming a pixel electrode on the passivation layer connected to the drain electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EXEMPLARY EMBODIMENTS

Reference will now be made in detail to the exemplary embodiments of the present invention, examples of which are illustrated in the accompanying drawings.

Figure 1:
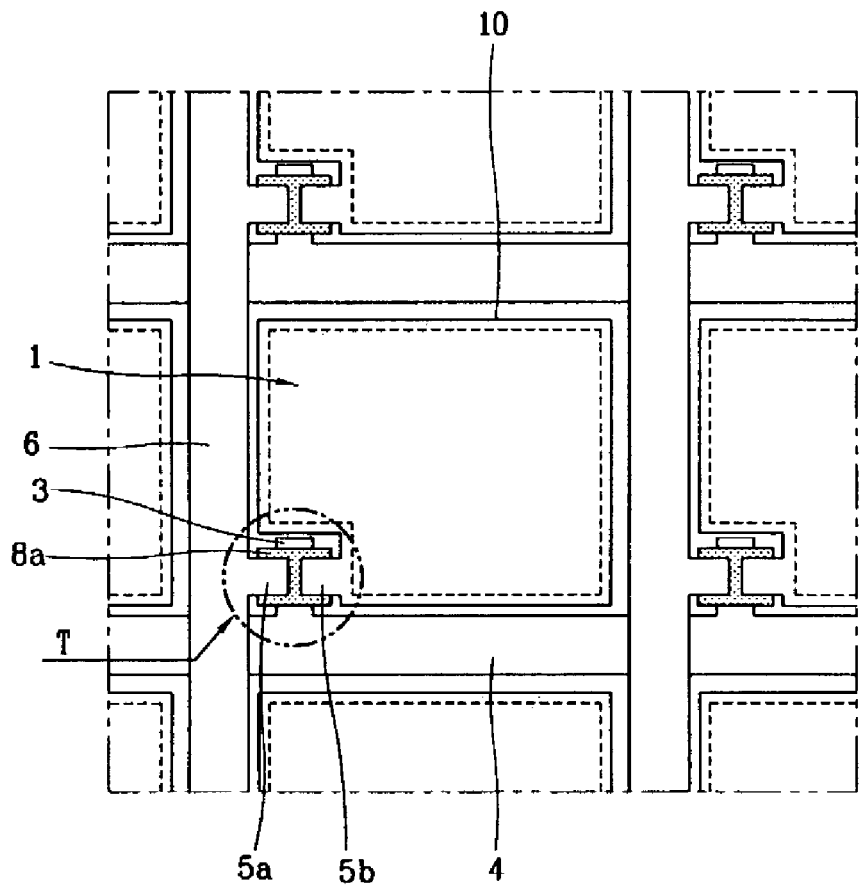
FIG. 1 is a plan view showing a related art LCD that uses a thin film transistor as an active device.
Figure 2:
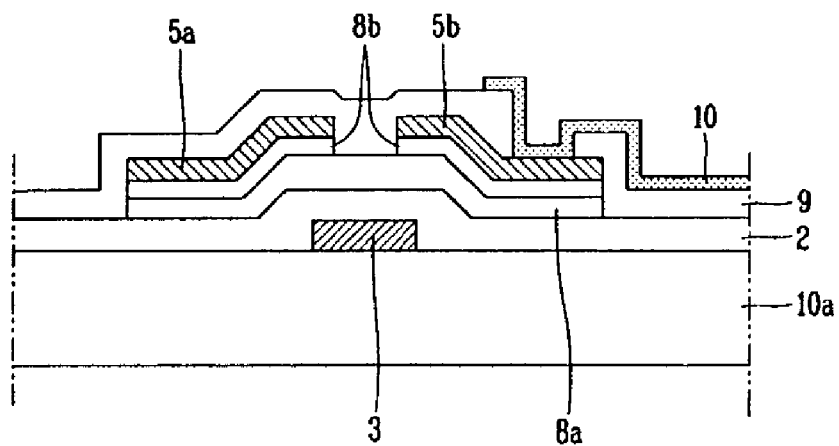
FIG. 2 is a cross sectional view of the related art TFT positioned in each pixel.
Figure 3A:
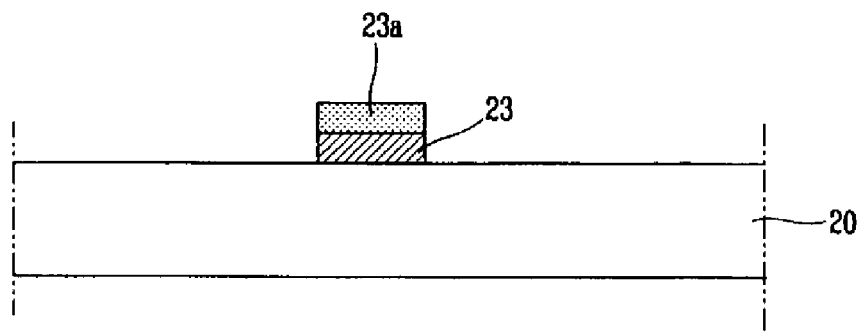
FIGS. 3A to 3E are views sequentially showing a TFT manufacturing process of a related art four mask process.
Figure 3B:
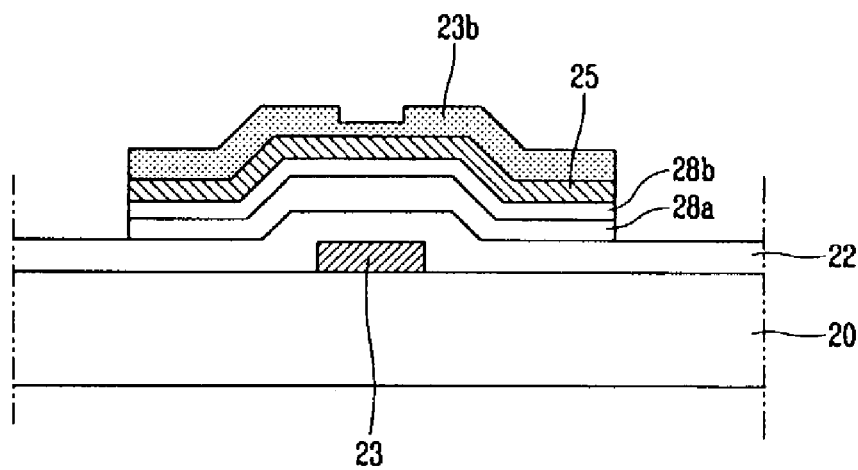
Figure 3C:
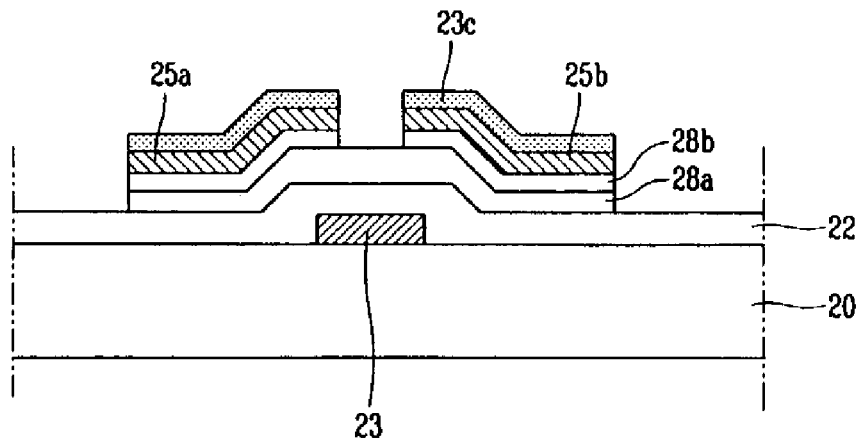
Figure 3D:
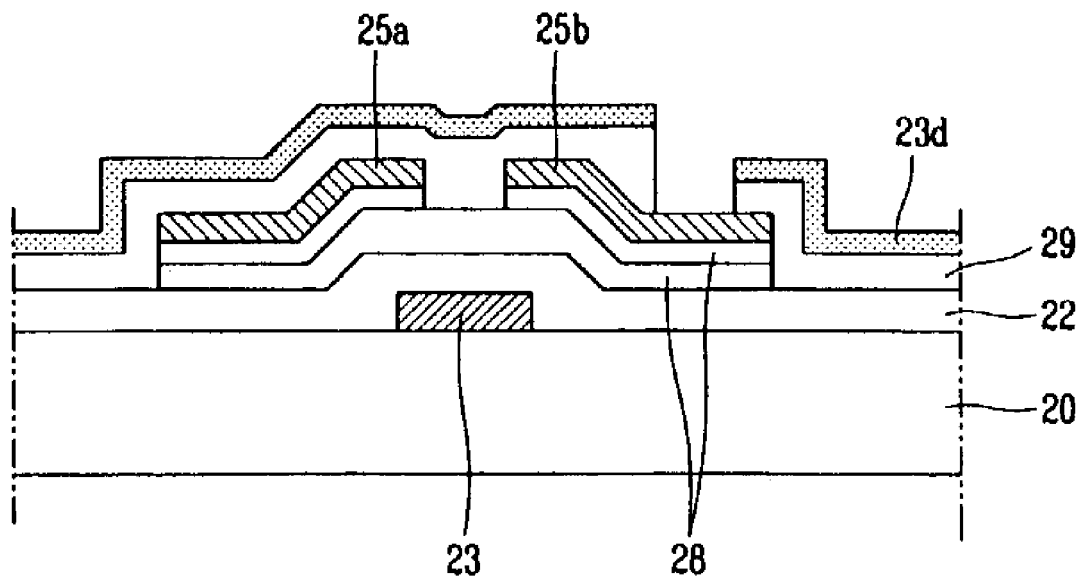
Figure 3E:
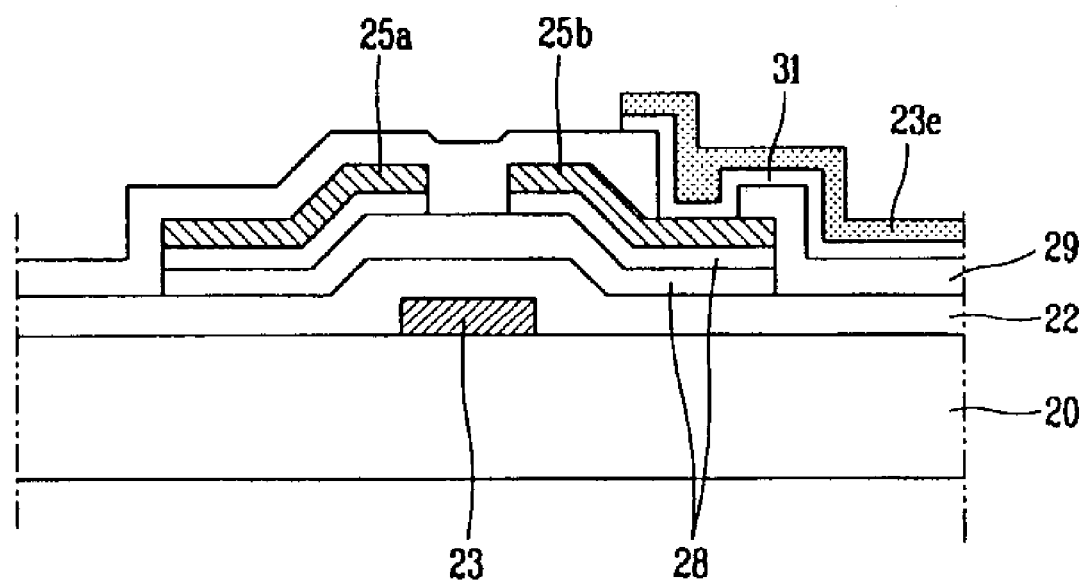
Figure 4A:
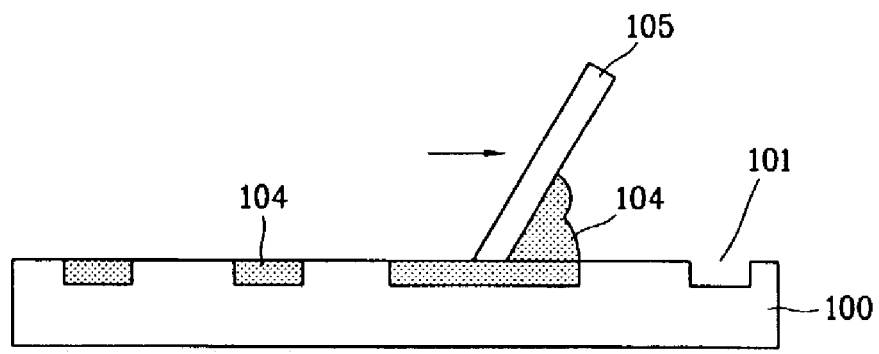
FIGS. 4A to 4C sequentially show a pattern forming method by a gravure offset printing method.
Figure 4B:
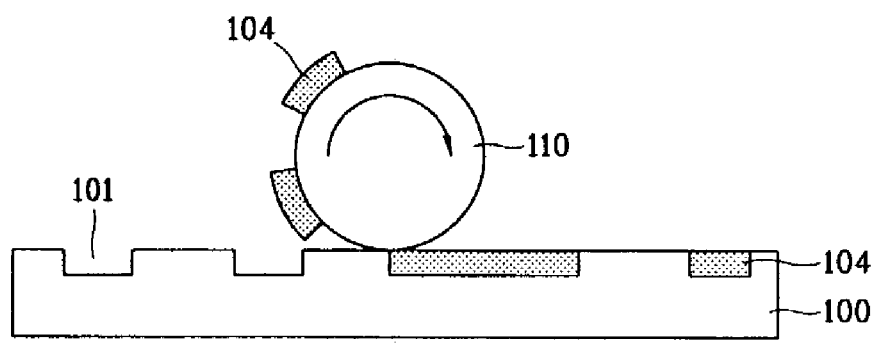
Figure 4C:
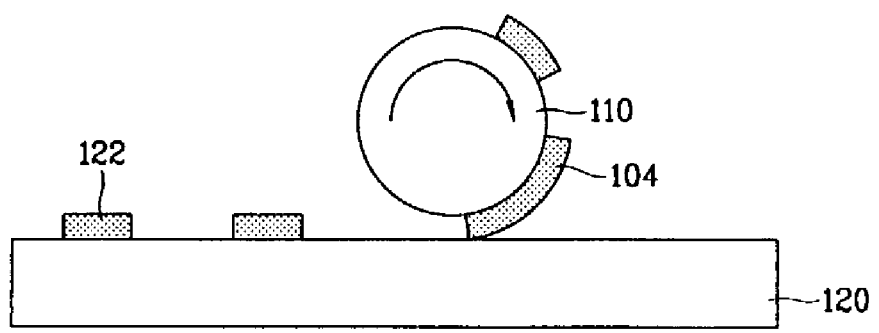

FIGS. 4A to 4C show a method for forming a pattern by a gravure offset printing method. As shown in FIG. 4A, a cliché 100 having a groove 101 is formed, and then resist 104 is filled into the groove 101. A doctor blade 105 is then used to flatten a surface of the cliché 100, so that the resist 104 is only filled into the groove 101. Then, as shown in FIG. 4B, a printing roll 110 is placed against the cliché 100 and rotated across the cliché 100 to transfer the resist 104 filled in the groove 101 of the cliché 100 to a surface of the printing roll 110. Then, as shown in FIG. 4C, the printing roll 110 is brought into to contact with a substrate 120 and rotated across the substrate 120 to apply a resist pattern 122 onto the substrate 120. Because the resist pattern 122 is formed by using the offset printing method, the masking process is simplified and takes less time, which increases productivity.

Figure 5A:
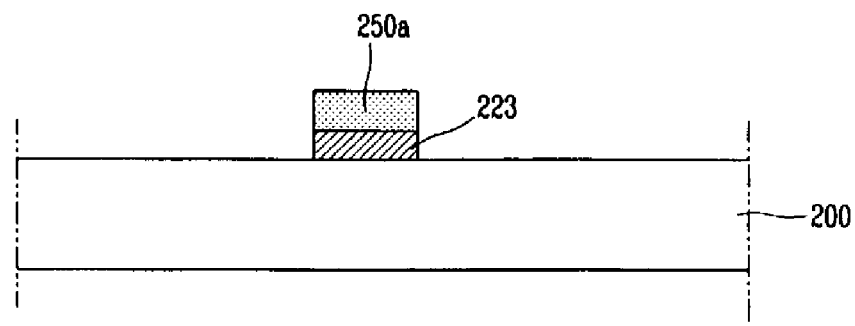
FIGS. 5A-5F is a view sequentially show a TFT process according to one embodiment of the present invention.

FIGS. 5A to 5F are views sequentially showing a method for fabricating a TFT by using the gravure offset printing method. As shown in FIG. 5A, a transparent substrate 200 having an insulation characteristic is provided, and a first metallic layer, such as Al or Cu, is deposited on the substrate 200 by a sputtering method. Then, a first resist pattern 250a is formed on the first metallic layer by the printing process described with regard to FIGS. 4A to 4C. The first metallic layer is then etched using the first resist pattern 250a as a mask to form a gate electrode 223.

Figure 5B:
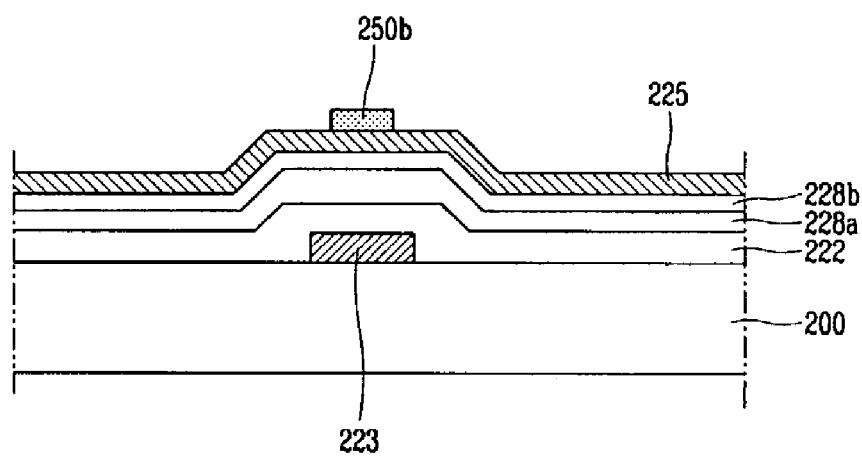

Subsequently, the first resist pattern 250a, which remains on the gate electrode 223, is removed. Then, as shown in FIG. 5B, an insulating layer 222, amorphous silicon layer (a-Si) 228a, n+ doped silicon layer 228b, and a second metallic layer 225 are sequentially deposited above the gate electrode 223. The insulating layer 222 can be formed of $SiO_x$ or $SiN_x$. A second resist pattern 250b is printed on the second metallic layer 225 directly overlapping the gate electrode 223. Depositing Cr, Mo, or Mo alloy, such as MoW, MoT, and MoNb, by a chemical vapor deposition or a sputtering method, forms the second metallic layer 225.

Figure 5C:
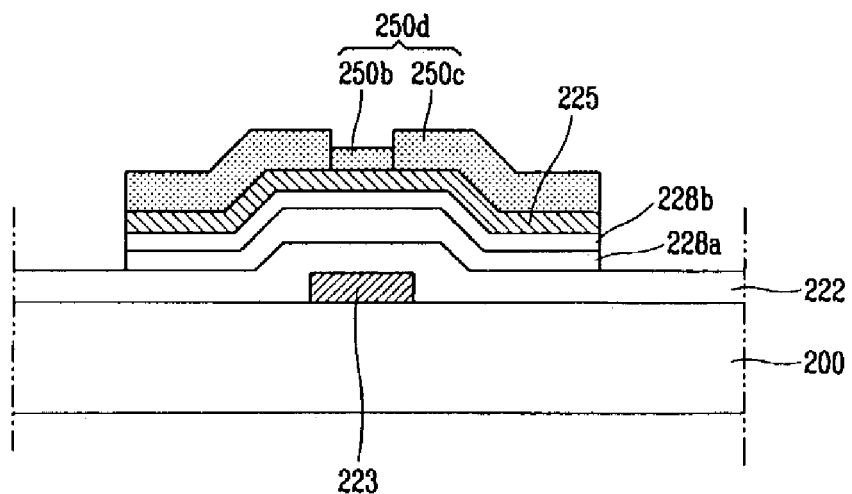

As shown in FIG. 5C, a third resist pattern 250c having portions separated from each other are printed on the second metallic layer 225 surrounding the second resist pattern 250b. The depth of the third resist pattern 250c is preferably deeper than that of the second resist pattern 250b. Hereinafter, a pattern similar in shape to the combination of the second pattern 250b and third resist pattern 250c will be called a fourth resist pattern 250d. As mentioned above with regard to the related art, a photoresist pattern having different thicknesses is formed by using a diffraction mask. However, in the exemplary embodiments of the present invention, two clichés in which one has a groove of a first depth and the other a second deeper are prepared to obtain the same resist pattern as obtained with a diffraction mask.

Figure 6A:
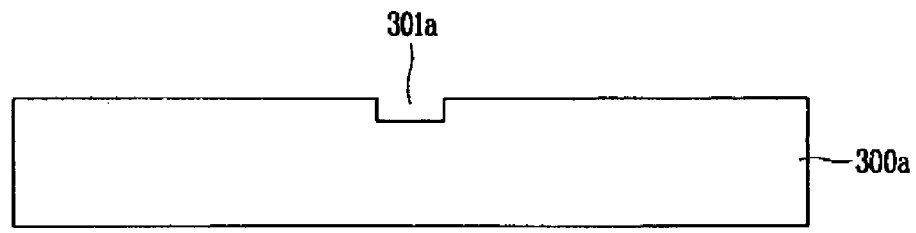
FIGS. 6A-6F are views sequentially showing a method for manufacturing the fourth resist pattern.
Figure 6B:
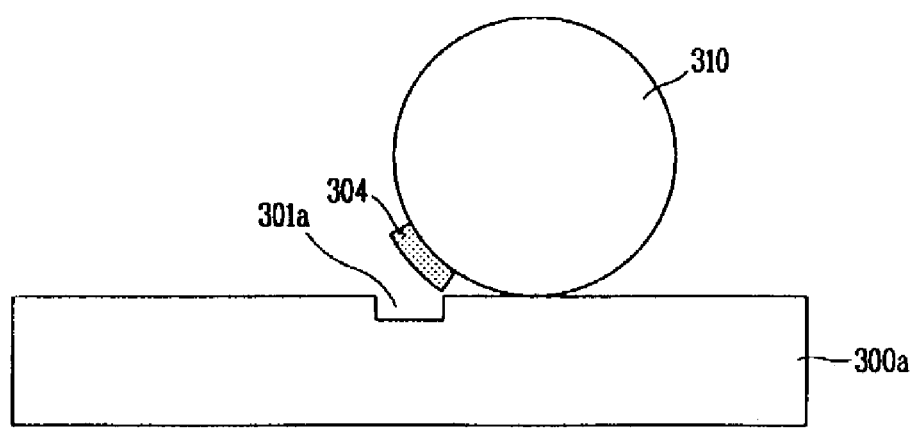
Figure 6C:
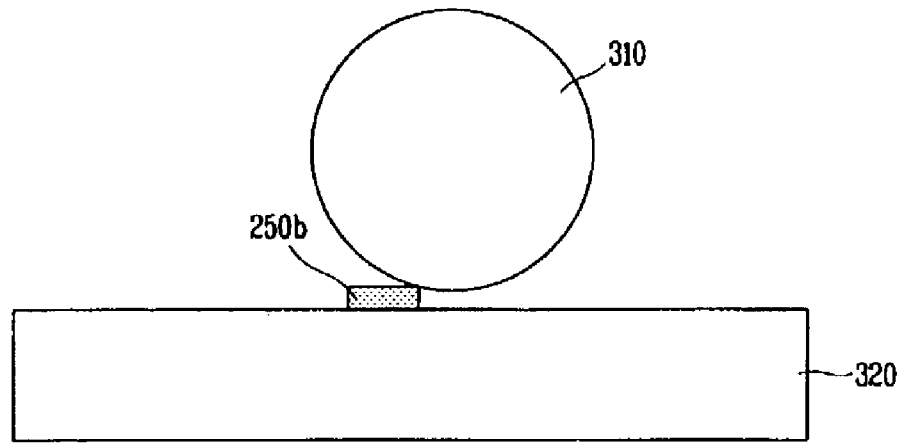

FIGS. 6A-6F are views sequentially showing a method for manufacturing the fourth resist pattern. As shown in FIG. 6A, a first cliché 300a having a first concave groove 301a having a depth at a position that will define the separation between the source and drain electrodes, such as the photoresist 250b shown in FIG. 5C is provided. A resist 304 is filled into the groove 301a. Then, as shown in FIG. 6B, a printing roll 310 is contacted to the surface of the cliché 300a and across the surface of the cliché 300a to transfer the resist 304 filled into the groove 301a to a surface of the printing roll 310. As shown in FIG. 6C, the resist 304 is transferred onto the printing roll 310 and solidified. The solidified resist is then applied onto a substrate 320 to form a second resist pattern 250b. Although not shown in detail, the gate electrode, the insulating layer, the semiconductor layer, and the second metallic layer are deposited on the substrate 320. Thus, in effect, the resist 304 is positioned on top of the second metallic layer like the second resist pattern 250b shown in FIG. 5B.

Figure 6D:
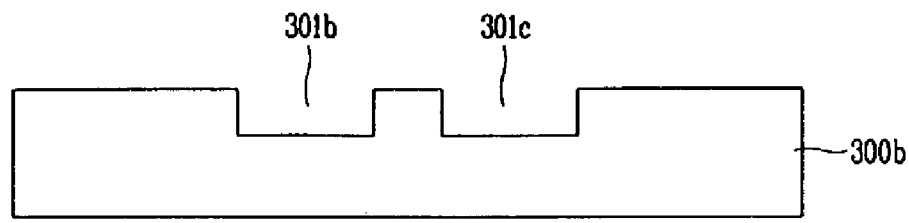
Figure 6E:
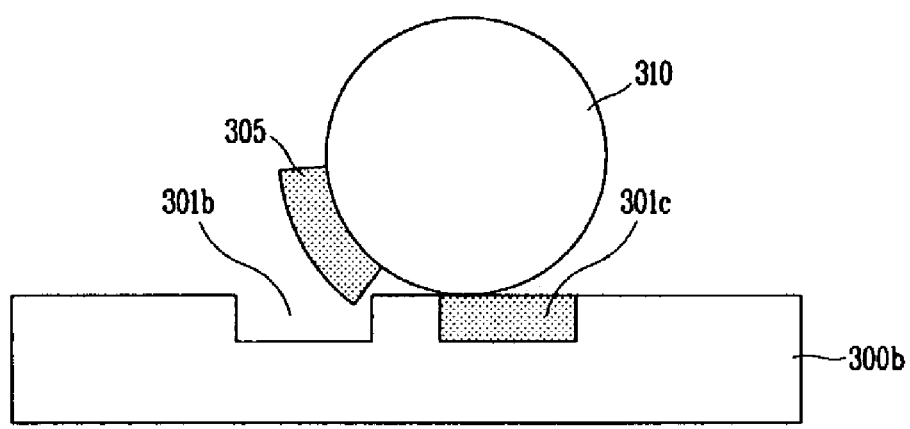
Figure 6F:
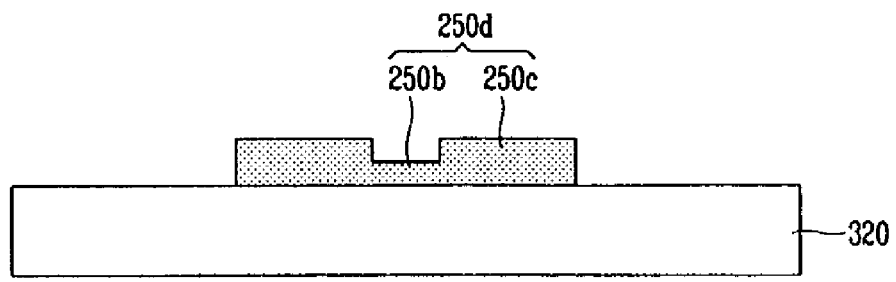

As shown in FIG. 6D, there is provided a second cliché 300b on which second and third grooves 301b and 301c are formed having a depth and positions that will define positions and shapes of the source and drain electrodes, as in the resist patterns 250c shown in FIG. 5C above. In order to obtain the effect of the diffraction exposure, the depth of the second and third grooves 301b and 301c has to be deeper than that of the first groove 301a. Then, as shown in FIG. 6E, resist 305 is filled into the second and third grooves 301b and 301c. Next, the resist is transferred on the printing roll 310, and then applied onto the substrate 320 on which the second resist pattern 250b was formed to surround and be connected to the first resist pattern. Accordingly, as shown in FIG. 6F, a resist pattern 250c corresponding to the second and third grooves 301b and 301c is provided to complete a fourth resist pattern 250d formed on the substrate. To maintain the shape of the resist detached from the cliché in the printing process, an ultraviolet light is irradiated from outside or a heater is mounted in the printing roll.

Figure 5D:
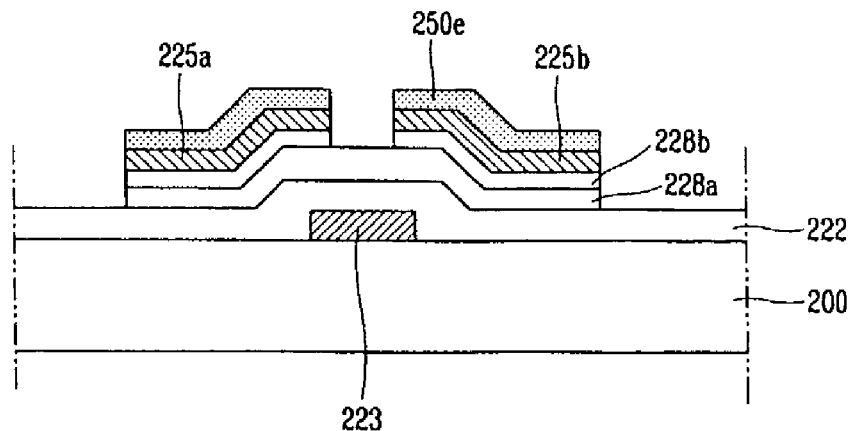

As shown in FIG. 5C, after forming the fourth resist pattern 250d by the printing method, the second metallic layer 225, the n+ silicon contact layer 228b, and the amorphous silicon active layer 228a are etched until the insulating layer 222 is exposed by using the fourth resist pattern 250d as a mask to form a patterned amorphous silicon active layer 228a, silicon contact layer 228b and second metallic layer 225. Then, as shown in FIG. 5D, a portion of the fourth resist pattern 250d is removed until the second metallic layer 225 of the channel region is exposed, thereby forming a fifth resist pattern 250e. The second metallic layer 225, the n+ silicon contact layer 228b are then etched until the amorphous silicon active layer 228a is exposed by using the fifth resist pattern 250e as a mask to form ohmic contact layers 228b, source electrode 225a and drain electrode 225b. Thus, a portion of the initially deposited resist pattern 250d has been used for patterning a first electrode, such as a source electrode, and a second electrode, such as the drain electrode, by using at least a portion of the resist pattern as a mask at least twice. More specifically, resist pattern 250e is a portion of resist pattern 250d. Further, the resist pattern 250e also patterns the silicon contact layer 228b into ohmic contacts that respectively connect the source and drain electrodes to the amorphous silicon active layer.

Figure 5E:
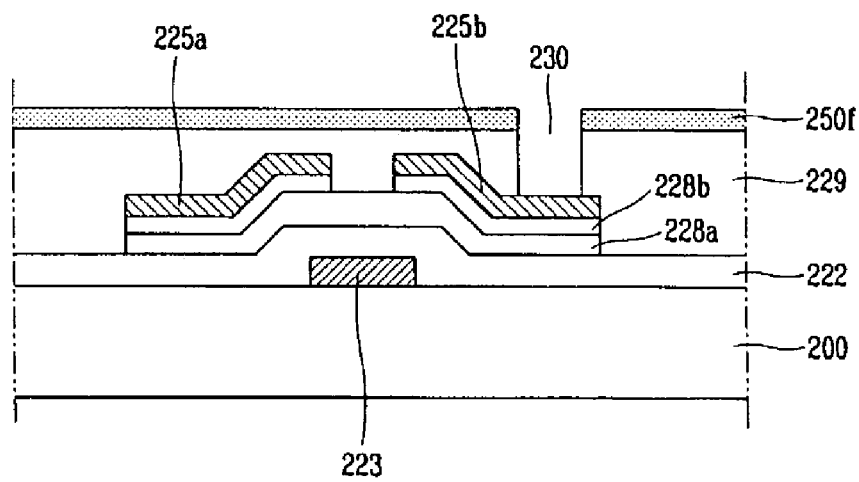

Afterwards, as shown in FIG. 5E, the fifth resist pattern 250e, which remains on the source electrode 225a and drain electrode 225b is removed. An inorganic material, such as $SiO_x$ or $SiN_x$, or organic material, such as BCB or acryl, are deposited to form a passivation layer 229. A sixth resist pattern 250f is then formed on the passivation layer 229 by using a printing process, and the passivation layer 229 is etched using the sixth resist pattern 250f as a mask to form a drain contact hole 230 in the passivation layer 229 that exposes a part of the drain electrode 225b.

Figure 5F:
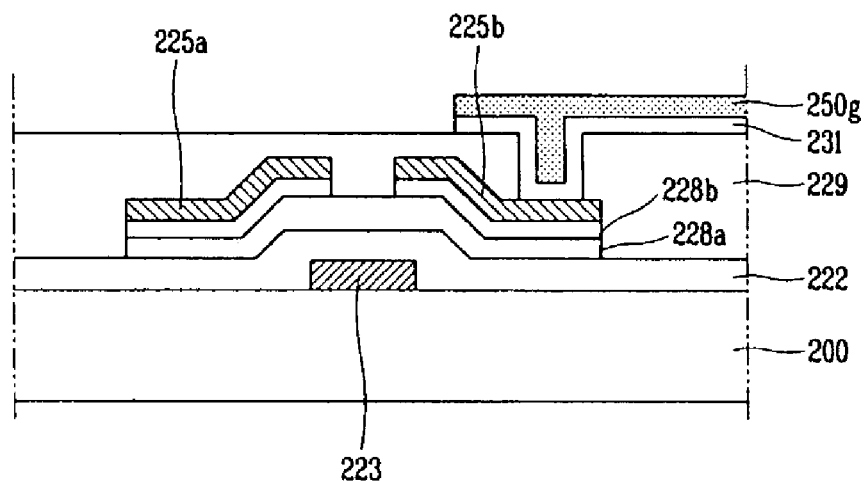

As shown in FIG. 5F, a transparent conductive material, such as Indium Tin Oxide (ITO) or Indium Zinc Oxide (IZO) is deposited on the passivation layer 229, and a seventh resist pattern 250g is formed over the passivation layer 229 by using a printing process. Then, the transparent conductive material layer is etched using the seventh resist pattern 250g as a mask to form a pixel electrode 231 that is electrically connected to the drain electrode 225b through the hole in the passivation layer 229.

The present invention is not limited to the gravure offset printing method in forming the resist pattern. Although not shown, a flexography printing method to form a pattern by using an offset plate having a convex portion or a micro contact printing method to form a pattern by applying resist on a substrate and then pushing the resist by a pre-manufactured stamp is also possible. To form the source electrode, drain electrode and the active layer using at least portions of a resist twice, the depth of a groove formed in the stamp corresponding to where the source and drain electrodes will be separated over the channel region has to be shallower than the resist over the source and drain electrodes. For example, the resist is pressed with a stamp to form resist pattern having first, second and third depressions in which a thickness of the first depression is thinner than the second and third depressions surrounding the first depression. Such a process can start by uniformly applying resist on the metallic layer formed over the substrate. Then, a stamp having first second and third grooves in which the first groove is shallower than the second and third grooves surrounding the first groove is placed in contact with the resist on the substrate. The stamp is then pressed into the resist, and removed to form a resist pattern having first, second and third depression in which a thickness of the first depression is thinner than the second and third depressions surrounding the first depression.

As aforementioned, in the present invention, the cliché having the grooves of different depths is prepared to form a multi-stepped resist pattern having different thicknesses. Alternatively, in the present invention, the resist pattern having different thicknesses can be formed with a one time printing process by using the cliché and the printing roll having multi-stepped grooves. More particularly, a multi-stepped resist pattern has at least two steps that are different sizes. For example, a resist pattern having a recessed groove.

Figure 7A:
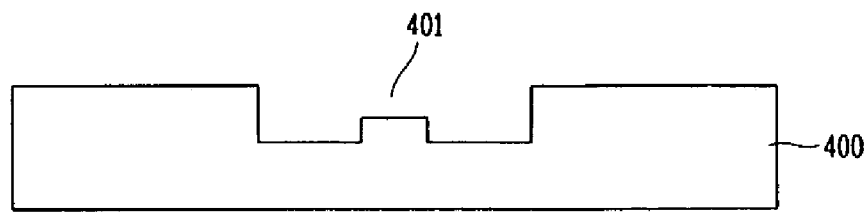
FIGS. 7A-7D are views showing a second exemplary embodiment of the present invention of a method for forming a resist pattern by using a cliche having multi-stepped grooves.
Figure 7B:
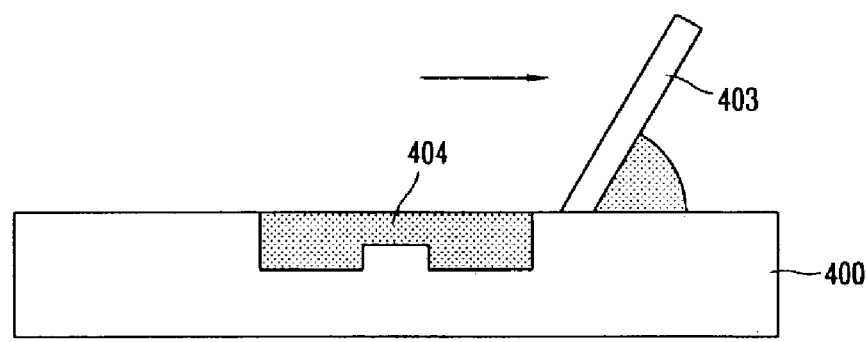
Figure 7C:
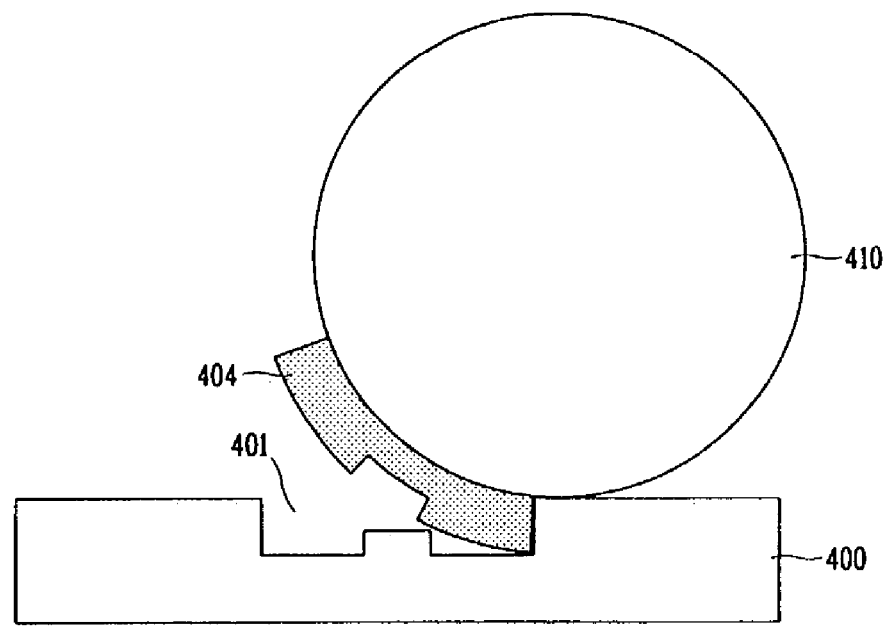
Figure 7D:
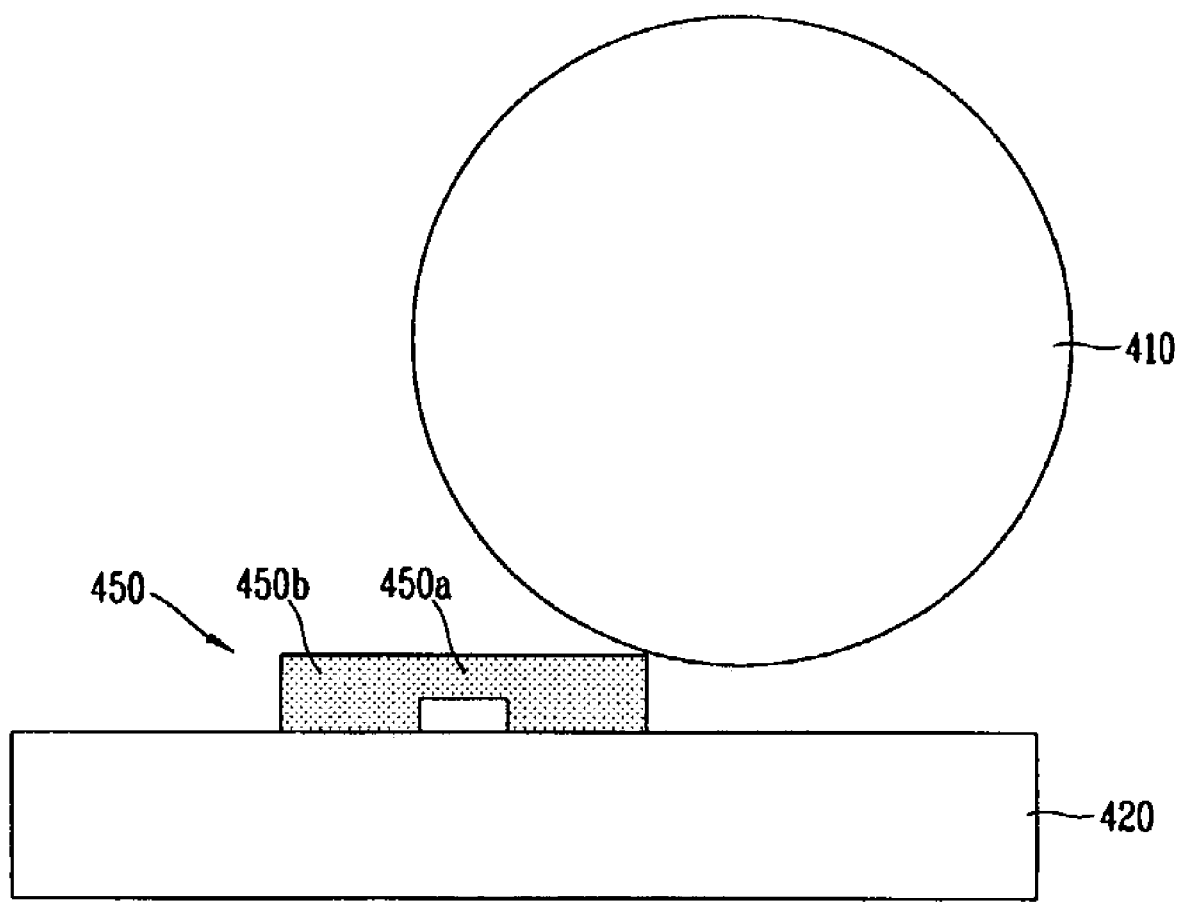

FIGS. 7A-7D are views showing a second exemplary embodiment of the present invention of a method for forming a resist pattern by using a cliché having multi-stepped grooves. As shown in FIG. 7A, a cliché 400 having a multi-stepped groove 401 of different depths is provided. As shown in FIG. 7B, a resist 404 is deposited onto the cliché 400, and then a doctor blade 403 is pulled to fill the resin into the groove 401 such that the resin 404 is flat with the surface of the cliché 400 and fills the groove 401. Then, as shown in FIG. 7C, a printing roll 410 is rolled across the surface of the cliché 400 to transfer the resist 404 filled into the groove 401 onto a surface of the printing roll 410. As shown in FIG. 7D, the resist 404 transferred onto the surface of the printing roll 410 is applied to a substrate 420 to forming resist pattern 450 having different thicknesses.

Figure 8A:
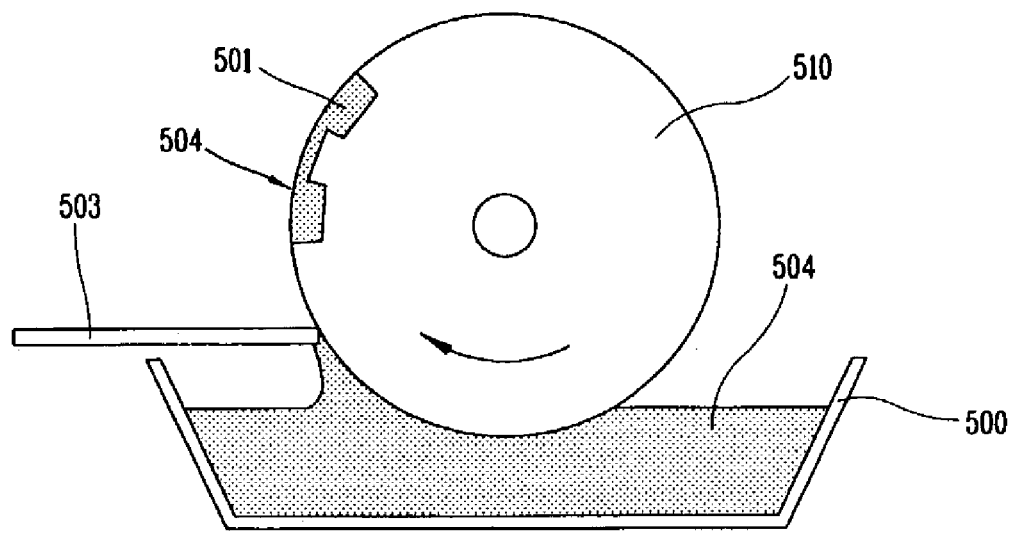
FIGS. 8A and 8B are views showing a third exemplary embodiment of the present invention of a method for forming a resist pattern by using a printing roll having multi-stepped grooves as another embodiment of the present invention.
Figure 8B:
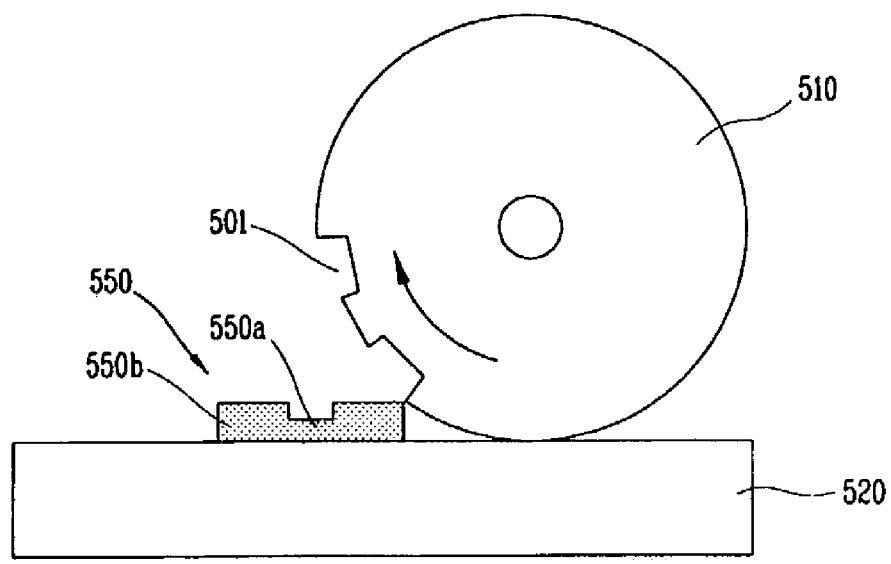

FIGS. 8A and 8B are views showing a third exemplary embodiment of the present invention of a method for forming the resist pattern by using a printing roll having multi-stepped grooves as another embodiment of the present invention. As shown in FIG. 8A, a printing roll 510 having a multi-stepped groove 501 is dipped into a bucket 500 in which resist 504 is filled. The printing roll 510 is rotated within the bucket 500 to fill the resist 504 into the grooves 501 of the printing roll 510. A doctor blade 503 is in contacted with the rotating surface of the printing roll 510 to remove resist which remains on the surface of the printing roll 510 that is not flush within groove 501. As shown in FIG. 8B, the printing roll 510 having the groove 501 filled with resist 504 is positioned to be in contact with substrate 520 and rolled across the substrate 520 to apply the resist 504 as a resist pattern 550 having different thicknesses.

To maintain a desired two-stepped pattern in the process, a resist having a viscosity of 90~120 cp has to be used. As aforementioned in one of the preferred embodiments, a resist pattern having different thicknesses can be formed with a one time printing process using a cliché or printing roll having a multi-stepped groove. Further, a resist pattern having different thicknesses can be formed with two different clichés. Accordingly, it is possible to form a resist pattern that can reduce the number of masks and the photolithography processes such that the overall manufacturing process is simpler.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a liquid crystal display device, comprising:
   (a) providing a transparent substrate;
   (b) depositing a first metallic layer on the substrate;
   (c) forming a first resist pattern on a first printing roll by transferring a resist in a first groove of a first cliché onto the first printing roll;
   (d) transferring the first resist pattern on the first printing roll onto the first metallic layer on the substrate;
   (e) etching the first metallic layer using the first resist pattern to form a gate electrode;
   (f) sequentially depositing an insulating layer, a semiconductor layer, a $n^+$ semiconductor layer, and a second metallic layer over an entire surface of the substrate;
   (g) forming a second resist pattern having a first thickness on a second printing roll by transferring the resist in the second groove having a first depth of the second cliché onto the second printing roll;
   (h) transferring the second resist pattern of the second printing roll onto the second metallic layer over the substrate;
   (i) forming third resist patterns having a second thickness on a third printing roll by transferring the resist in the third grooves having a second depth of the third cliché onto the third printing roll, the second depth of the third cliché being deeper than the first depth of the second cliché so the second thickness of the third pattern being thicker than the first thickness of the second pattern;
   (j) transferring the third resist pattern of the third printing roll onto the second metallic layer over the substrate, the third resist pattern being disposed at the both sides of the second resist pattern;
   (k) etching the second metallic layer, the $n^+$semiconductor layer, and the semiconductor layer by using the second and third resist patterns;
   (l) removing the second resist pattern and a part of the upper portion of the third resist pattern to expose a part of the etched second metallic layer; and
   (m) etching the exposed second metallic layer and the $n^+$semiconductor layer of the exposed portion of the second metallic layer by using the partially removed third resist pattern to form a source electrode and a drain electrode;
   (n) forming a passivation layer on the source electrode and drain electrode over the substrate;
   (o) depositing a transparent conductive layer on the passivation layer;
   (p) forming a fourth resist pattern on a fourth printing roll by transferring the resist in a fourth groove of a fourth cliché onto the fourth printing roll;
   (q) transferring the fourth resist pattern on the fourth printing roll onto the transparent conductive layer on the substrate;
   (s) etching the transparent conductive layer using the fourth resist pattern to form a pixel electrode connected to the drain electrode through the contact hole,
   wherein the second resist pattern and third resist pattern on the printing roll are heated by a heater mounted in the printing roll or irradiated by a ultraviolet light during the (h) and (j) steps.

* * * * *